United States Patent
Gibson

(10) Patent No.: US 10,651,321 B2
(45) Date of Patent: May 12, 2020

(54) SOLAR MODULE HAVING A PLURALITY OF STRINGS CONFIGURED FROM A FIVE STRIP CELL

(71) Applicant: SOLARIA CORPORATION, Fremont, CA (US)

(72) Inventor: Kevin R. Gibson, Redwood City, CA (US)

(73) Assignee: SOLARIA CORPORATION, Fremont, CA (US)

( * ) Notice: Subject to any disclaimer, the term of this patent is extended or adjusted under 35 U.S.C. 154(b) by 212 days.

(21) Appl. No.: 15/611,714

(22) Filed: Jun. 1, 2017

(65) Prior Publication Data

US 2017/0301802 A1    Oct. 19, 2017

Related U.S. Application Data

(63) Continuation-in-part of application No. 14/609,307, filed on Jan. 29, 2015.
(Continued)

(51) Int. Cl.
*H01L 31/02* (2006.01)
*H01L 31/153* (2006.01)
(Continued)

(52) U.S. Cl.
CPC ........ *H01L 31/0201* (2013.01); *H01L 31/044* (2014.12); *H01L 31/0508* (2013.01); *H01L 31/18* (2013.01); *Y02E 10/50* (2013.01)

(58) Field of Classification Search
None
See application file for complete search history.

(56) References Cited

U.S. PATENT DOCUMENTS

2011/0079283 A1    4/2011  Avrutsky
2012/0180843 A1    7/2012  Park
(Continued)

FOREIGN PATENT DOCUMENTS

| EP | 2 284 908 A1 | 2/2011 |
| KR | 10-2011-0031071 A | 3/2011 |
| KR | 10-2013-0027900 A | 3/2013 |

OTHER PUBLICATIONS

International Search Report and Written Opinion for International Patent Application No. PCT/US2016/015800, dated May 12, 2016.

*Primary Examiner* — Magali P Slawski

(57) ABSTRACT

In an example, the present invention provides a method of manufacturing a solar module. The method includes providing a substrate member having a surface region, the surface region comprising a spatial region, a first end strip comprising a first edge region and a first interior region, the first interior region comprising a first bus bar, a plurality of strips, a second end strip comprising a second edge region and a second interior region, the second edge region comprising a second bus bar, the first end strip, the plurality of strips, and the second end strip arranged in parallel to each other and occupying the spatial region such that the first end strip, the second end strip, and the plurality of strips consists of a total number of five (5) strips. The method includes separating each of the plurality of strips, arranging the plurality of strips in a string configuration, and using the string in the solar module.

13 Claims, 23 Drawing Sheets

Related U.S. Application Data

(60) Provisional application No. 62/349,535, filed on Jun. 13, 2016.

(51) Int. Cl.
*H01L 31/173* (2006.01)
*H01L 31/18* (2006.01)
*H01L 31/05* (2014.01)
*H01L 31/044* (2014.01)

(56) References Cited

U.S. PATENT DOCUMENTS

| | | | |
|---|---|---|---|
| 2012/0305047 A1* | 12/2012 | Taira | H01L 31/022433 136/244 |
| 2013/0206221 A1* | 8/2013 | Gannon | H01L 31/0201 136/256 |
| 2013/0255777 A1* | 10/2013 | Lee | H01L 31/02167 136/259 |
| 2014/0374669 A1* | 12/2014 | Hardin | H01L 31/022425 252/513 |

* cited by examiner

FIG. 4
FIG. 5
FIG. 6
FIG. 7

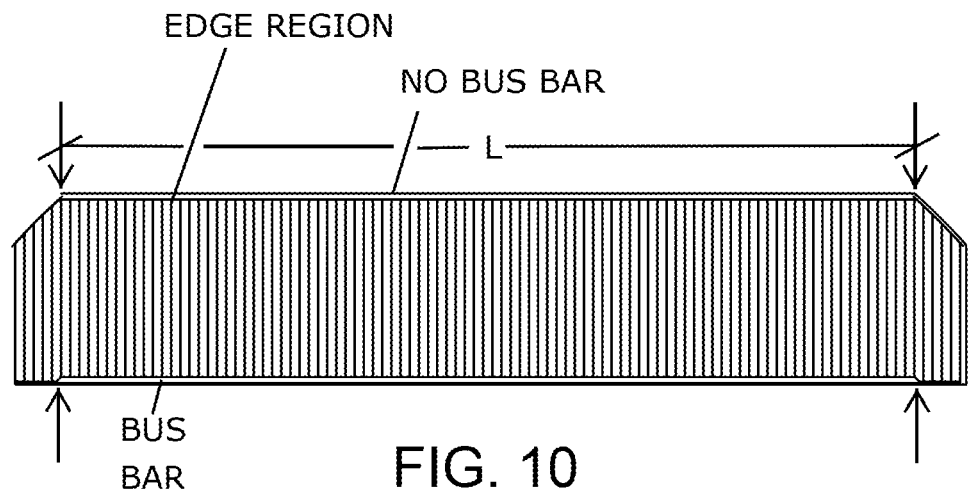
FIG. 10
FIG. 11
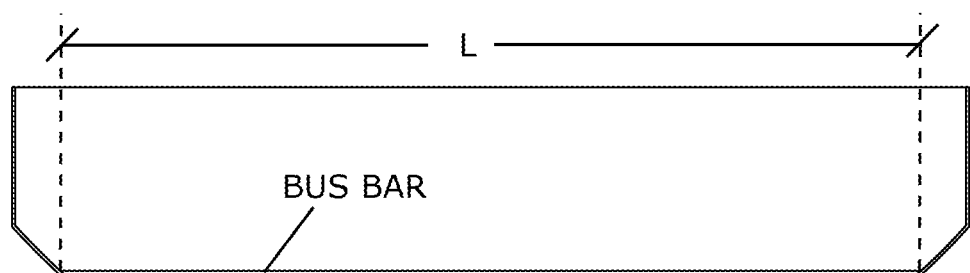
FIG. 12

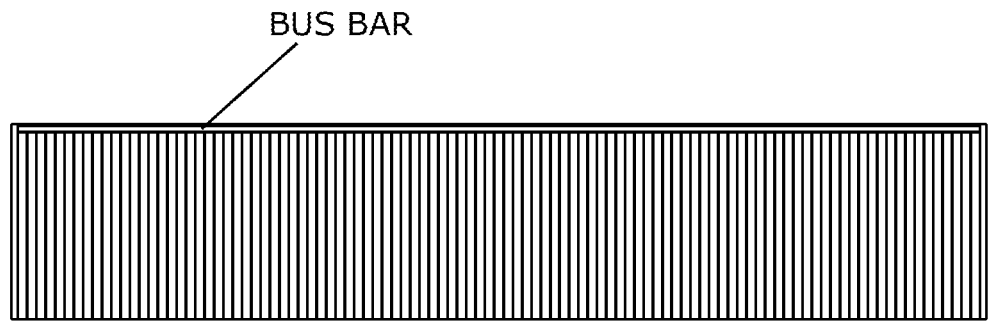
FIG. 15
FIG. 16
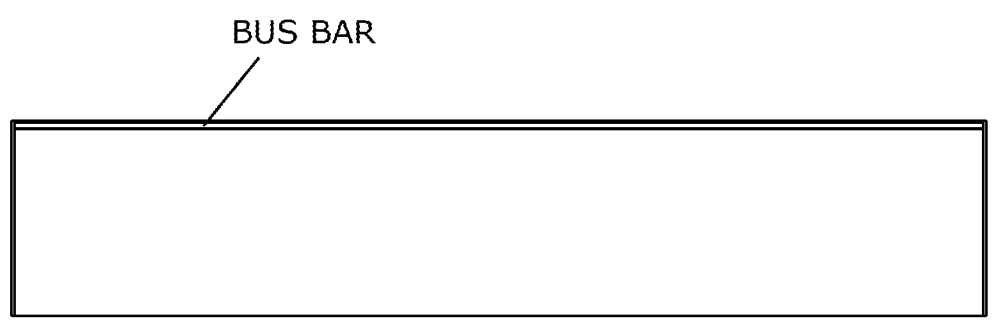
FIG. 17

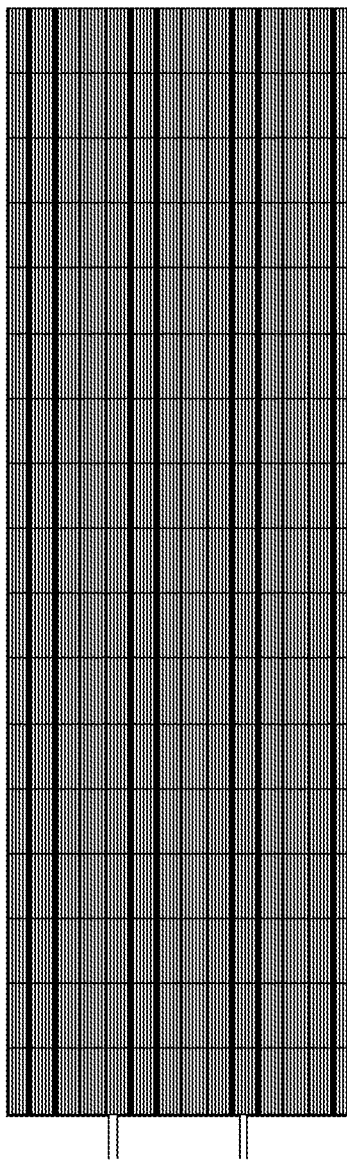
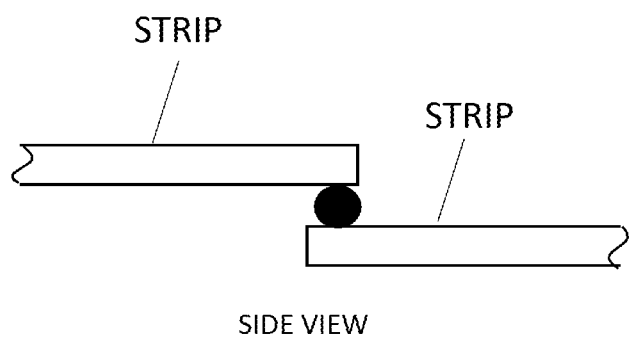
FIG. 18A
FIG. 18B

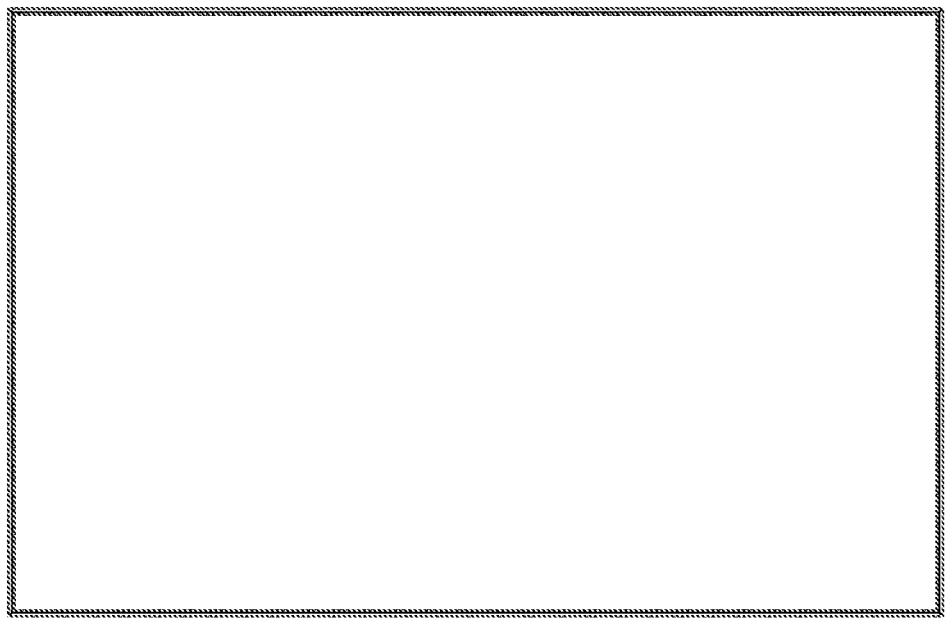
FIG. 21
FIG. 22
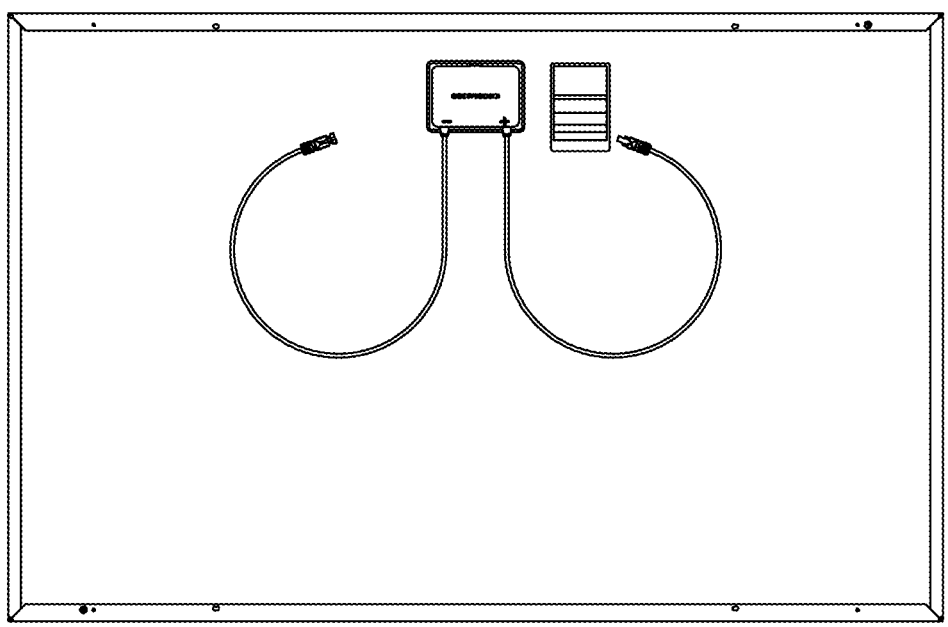
FIG. 23

SOLAR MODULE HAVING A PLURALITY OF STRINGS CONFIGURED FROM A FIVE STRIP CELL

CROSS-REFERENCE TO RELATED APPLICATIONS

This application claims priority to U.S. Provisional No. 62/349,535, filed on Jun. 13, 2016, which is incorporated by reference herein.

BACKGROUND OF THE INVENTION

The present invention is directed to photovoltaic systems and manufacturing processes and apparatus thereof. In particular, the present invention provides an apparatus and method for a high-density solar module.

As the population of the world has increased, industrial expansion has led to a corresponding increased consumption of energy. Energy often comes from fossil fuels, including coal and oil, hydroelectric plants, nuclear sources, and others. As merely an example, the International Energy Agency projects further increases in oil consumption, with developing nations such as China and India accounting for most of the increase. Almost every element of our daily lives depends, in part, on oil, which is becoming increasingly scarce. As time further progresses, an era of "cheap" and plentiful oil is coming to an end. Accordingly, other and alternative sources of energy have been developed.

In addition to oil, we have also relied upon other very useful sources of energy such as hydroelectric, nuclear, and the like to provide our electricity needs. As an example, most of our conventional electricity requirements for home and business use comes from turbines run on coal or other forms of fossil fuel, nuclear power generation plants, and hydroelectric plants, as well as other forms of renewable energy. Often times, home and business use of electrical power has been stable and widespread.

Most importantly, much if not all of the useful energy found on the Earth comes from our sun. Generally all common plant life on the Earth achieves life using photosynthesis processes from sunlight. Fossil fuels such as oil were also developed from biological materials derived from energy associated with the sun. For human beings including "sun worshipers," sunlight has been essential. For life on the planet Earth, the sun has been our most important energy source and fuel for modern day solar energy.

Solar energy possesses many desirable characteristics; it is renewable, clean, abundant, and often widespread. Certain technologies developed often capture solar energy, concentrate it, store it, and convert it into other useful forms of energy.

Solar panels have been developed to convert sunlight into energy. For example, solar thermal panels are used to convert electromagnetic radiation from the sun into thermal energy for heating homes, running certain industrial processes, or driving high-grade turbines to generate electricity. As another example, solar photovoltaic panels are used to convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successfully for certain applications, there are still certain limitations. Solar cells are often costly. Depending upon the geographic region, there are often financial subsidies from governmental entities for purchasing solar panels, which often cannot compete with the direct purchase of electricity from public power companies. Additionally, the panels are often composed of costly photovoltaic silicon bearing wafer materials, which are often difficult to manufacture efficiently on a large scale, and sources can be limited.

Therefore, it is desirable to have novel system and method for manufacturing solar panels.

BRIEF SUMMARY OF THE INVENTION

The present invention is directed to photovoltaic systems and manufacturing processes and apparatus thereof. In particular, the present invention provides an apparatus and method for using diode protection for a high-density solar module. In an example, the present method uses one of three inner strips separated from a photovoltaic material while two other strips are not included. There are other embodiments as well.

In an example, the present invention provides a method of manufacturing a solar module. The method includes providing a substrate member having a surface region, the surface region comprising a spatial region, a first end strip comprising a first edge region and a first interior region, the first interior region comprising a first bus bar, a plurality of strips, a second end strip comprising a second edge region and a second interior region, the second edge region comprising a second bus bar, the first end strip, the plurality of strips, and the second end strip arranged in parallel to each other and occupying the spatial region such that the first end strip, the second end strip, and the plurality of strips consists of a total number of five (5) strips. The method includes separating each of the plurality of strips, arranging the plurality of strips in a string configuration, and using the string in the solar module.

In an example, a solar module apparatus is provided. The apparatus has a plurality of strings, each of the plurality of strings being configured in a parallel electrical arrangement with each other and a plurality of photovoltaic strips forming each of the plurality of photovoltaic strings. The apparatus has a first end termination configured along a first end of each of the plurality of strings and a second end termination configured along a second end of each of the plurality of strings. The module has an equivalent diode device configured between the first end termination and the second end termination such that one of the plurality of photovoltaic strips associated with one of the plurality of strings when shaded causes the plurality of strips ("Shaded Strips") associated with the one of the strings to cease generating electrical current from application of electromagnetic radiation, while a remaining plurality of strips, associated with the remaining plurality of strings, each of which generates a current that is substantially equivalent as an electrical current while the Shaded Strips are not shaded, and the equivalent diode device between the first terminal and the second terminal for the plurality of strips is configured to turn-on to by-pass electrical current through the equivalent diode device such that the electrical current that was by-passed traverses the equivalent diode device coupled to the plurality of strips that are configured parallel to each other. In an example, whereupon each of the plurality of strips has an aperture region and has been derived from one of three inner strips configured from and separated from a photovoltaic substrate member, while a pair of other strips are not included.

Many benefits can be achieved by ways of the present invention. As an example, the present module can be made using conventional process and materials. Additionally, the present module is more efficient than conventional module designs. Furthermore, the present module, and related techniques provides for a more efficient module usage using by-pass diodes configured with multiple zones of solar cells. Depending upon the example, there are other benefits as well.

A further understanding of the nature and advantages of the present invention may be realized by reference to the remaining portions of the specification and the drawings.

BRIEF DESCRIPTION OF THE DRAWINGS

FIG. 4 is a top view thereof;

FIG. 5 is a bottom view thereof;

FIG. 6 is a first side view thereof;

FIG. 7 is a second side view thereof;

FIGS. 8-12 are illustrations of an edge photovoltaic strip according to an example of the present invention;

FIGS. 13-17 are illustrations of a center photovoltaic strip according to an example of the present invention;

FIGS. 18A and 18B-20 illustrate a photovoltaic strip according to an example of the present invention;

FIGS. 21-25 illustrate a solar module according to an example of the present invention;

DETAILED DESCRIPTION OF THE INVENTION

The present invention is directed to photovoltaic systems and manufacturing processes and apparatus thereof. There are other embodiments as well.

Embodiments of the present invention provide system and methods for manufacturing high density solar panels. Embodiments of the present invention use overlapped or tiled photovoltaic strip elements to increase the amount of photovoltaic material, thereby increasing an amount of power, while reducing an amount of series resistance losses in the solar panel. It is noted that specific embodiments are shown for illustrative purposes, and represent examples. One skilled in the art would recognize other variations, modifications, and alternatives.

Although orientation is not a part of the invention, it is convenient to recognize that a solar module has a side that faces the sun when the module is in use, and an opposite side that faces away from the sun. Although, the module can exist in any orientation, it is convenient to refer to an orientation where "upper" or "top" refer to the sun-facing side and "lower" or "bottom" refer to the opposite side. Thus an element that is said to overlie another element will be closer to the "upper" side than the element it overlies.

Figure 1:
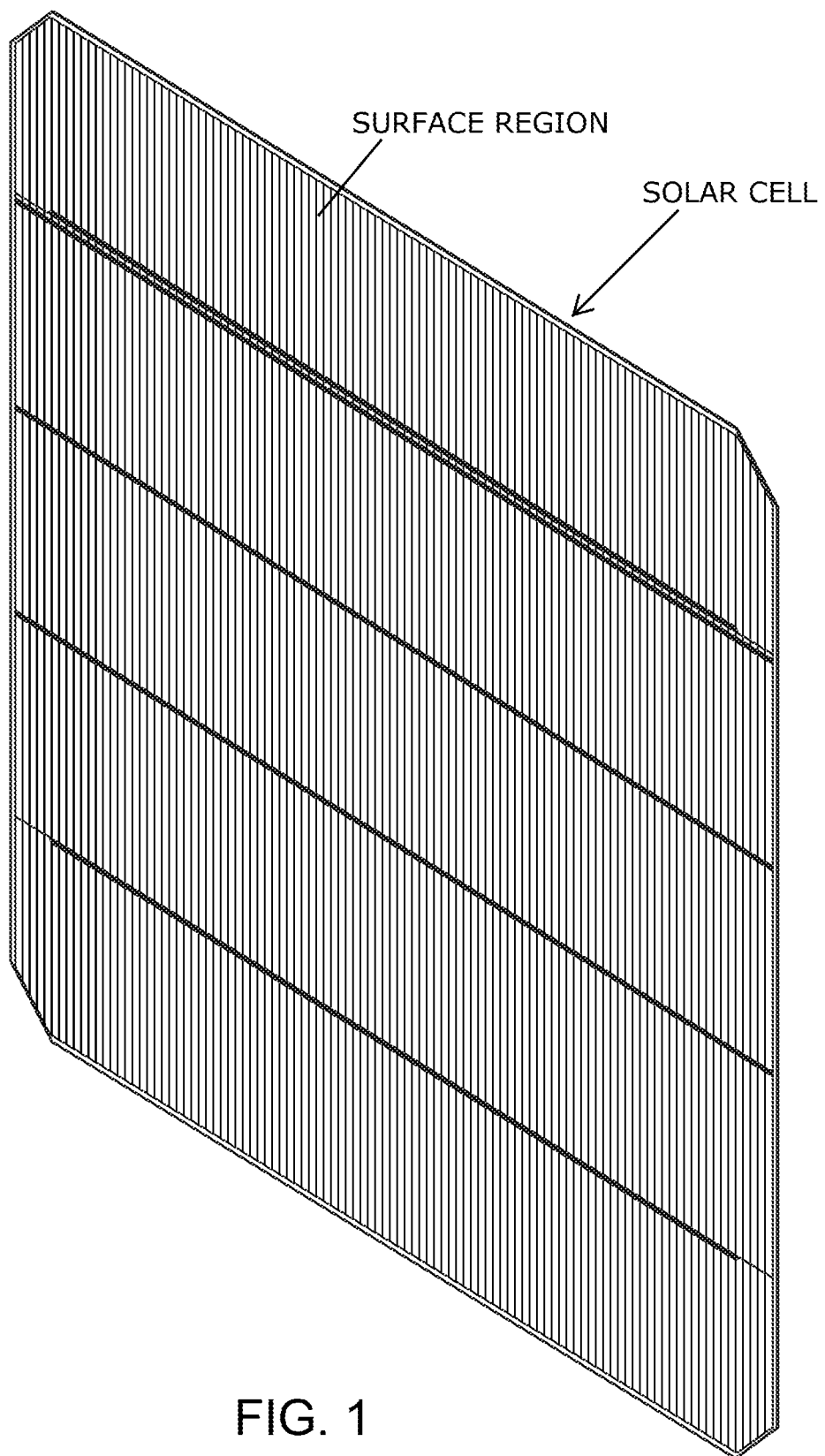
FIG. 1 is a front perspective view of a solar cell article according to an example of the present.
Figure 2:
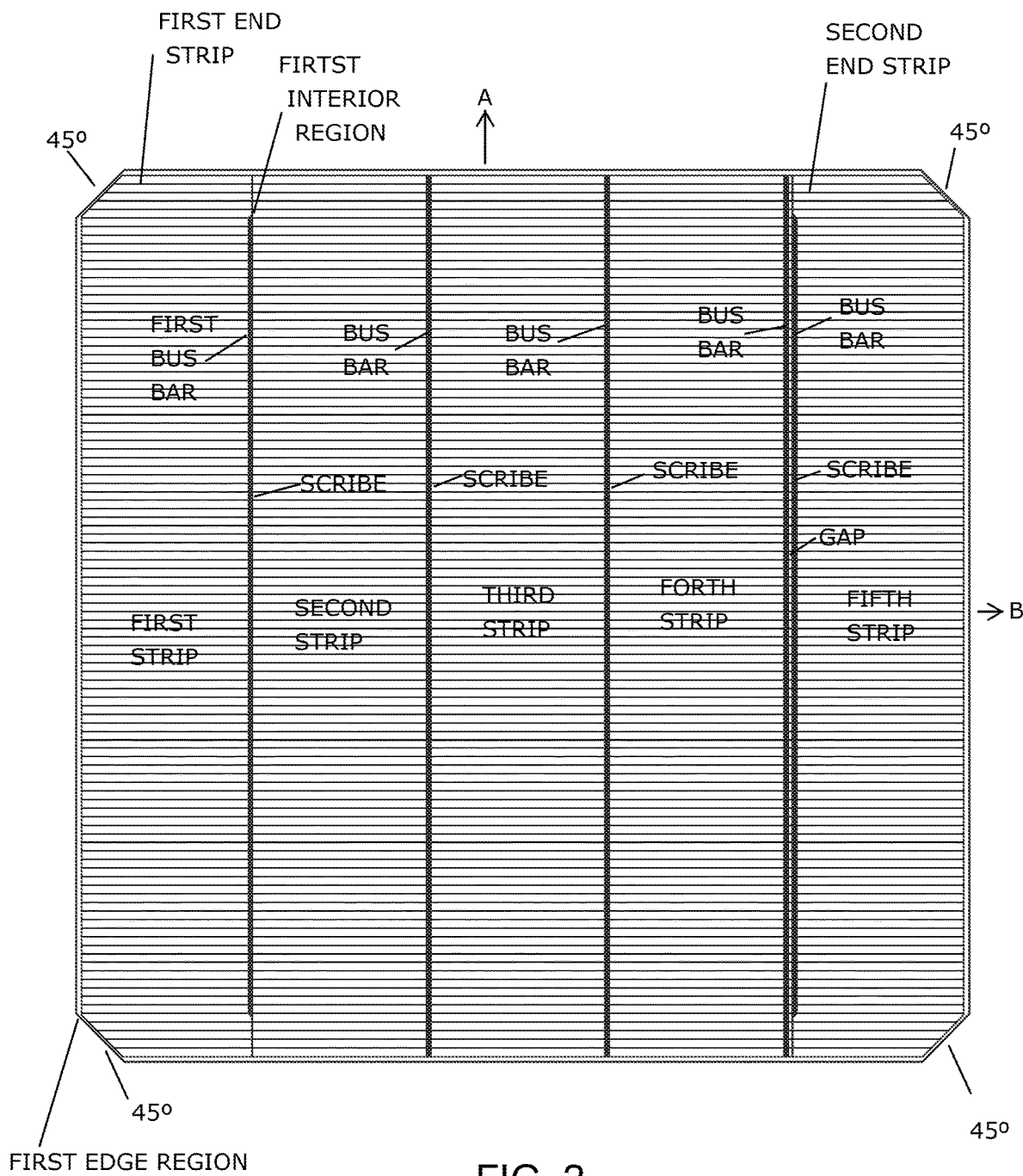
FIG. 2 is a front view thereof.
Figure 3:
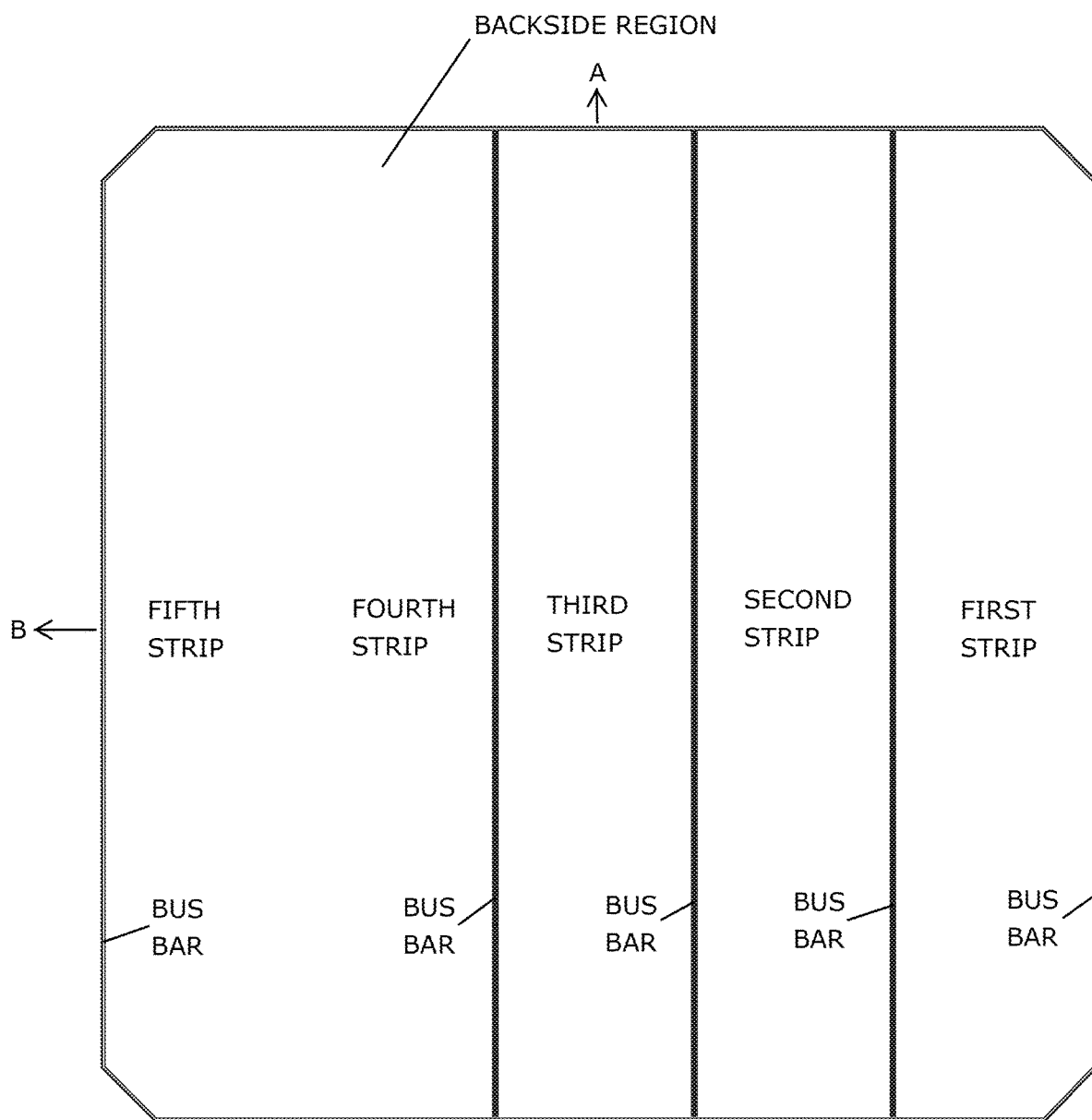
FIG. 3 is a back view thereof.
Figure 8:
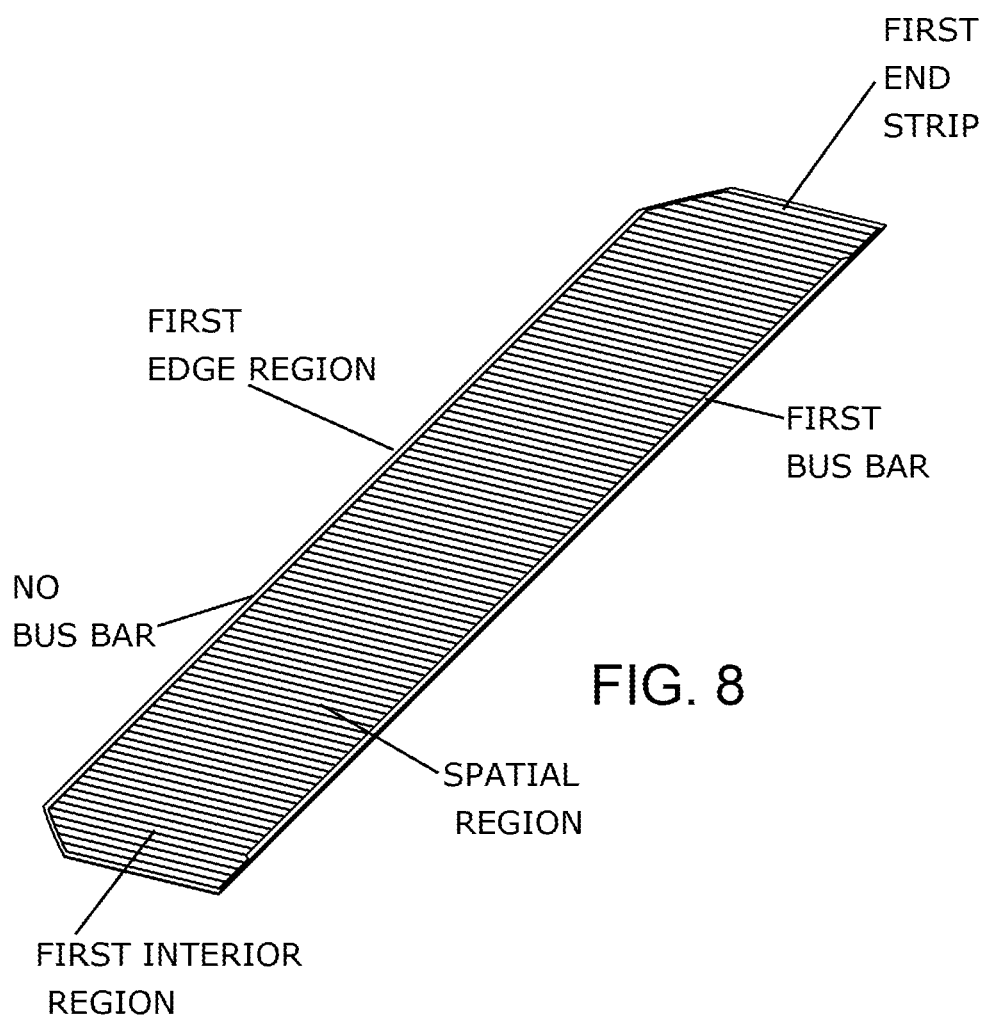

FIG. 1 is a front perspective view of a solar cell article according to an example of the present. This diagram is merely an example, and should not unduly limit the scope of the claims herein. One of ordinary skill in the art would recognize other variations, modifications, and alternatives. FIG. 2 is a front view thereof. FIG. 3 is a back view thereof. FIG. 4 is a top view thereof. FIG. 5 is a bottom view thereof. FIG. 6 is a first side view thereof. FIG. 7 is a second side view thereof. A solar cell is shown. The solar cell has a substrate member having a surface region. The surface region is an aperture region exposing photovoltaic material. In an example, the photovoltaic material can be silicon, polycrystalline silicon single crystalline silicon, or other material.

In an example, the cell has the surface region comprising a spatial region and a backside region. The cell has a first end strip comprising a first edge region and a first interior region as provided on the spatial region. In an example, the first interior region comprising a first bus bar, while the first edge region on the spatial region has no bus bar. In an example, the first end strip has an off cut on each corner. Each of the off cuts is about 45 degrees in angle, and has a flat edge abutting a pair of edges at ninety degrees from each other, as shown.

After the first bus bar, the solar cell has a plurality of strips are provided on the spatial region. As show, each of the strips having a bus bar along an edge furthest away from the first bus bar. Each of the bus bars shown in FIG. 2 also include a scribe region adjacent to the bus bar, and the scribe region is between the bus bar on the front side, and a bus bar on an adjacent strip on the backside, except for the pair of bus bars on the front side between the fourth and fifth strips. Each of the strips is substantially rectangular in shape, and can be configured with edges at ninety degrees from each other.

In an example, the cell has a second end strip comprising a second edge region and a second interior region. In an example, the second interior region comprises a second bus bar such that the second bus bar and the bus bar from one of the plurality of strips forms a gap defining a scribe region. In an example, the second edge region comprises no bus bar.

In an example, the first end strip, the plurality of strips, and the second end strip arranged in parallel to each other and occupying the spatial region such that the first end strip, the second end strip, and the plurality of strips consists of a total number of five (5) strips.

In an example, the backside region comprises the second end strip comprising the second edge region. In an example, the second edge region has a second backside bus bar such that the second backside bus bar and the second bus bar are provided between photovoltaic material of the second end strip.

Figure 9:
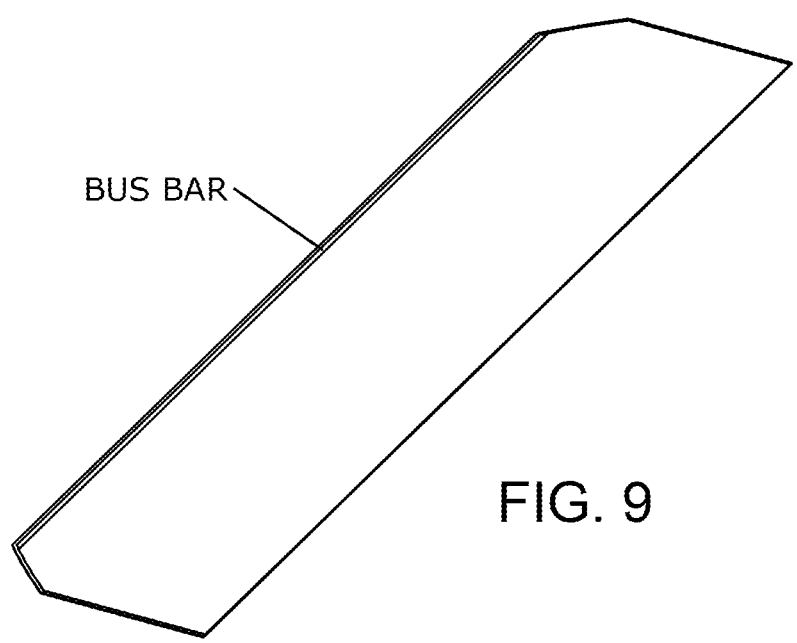
Figure 13:
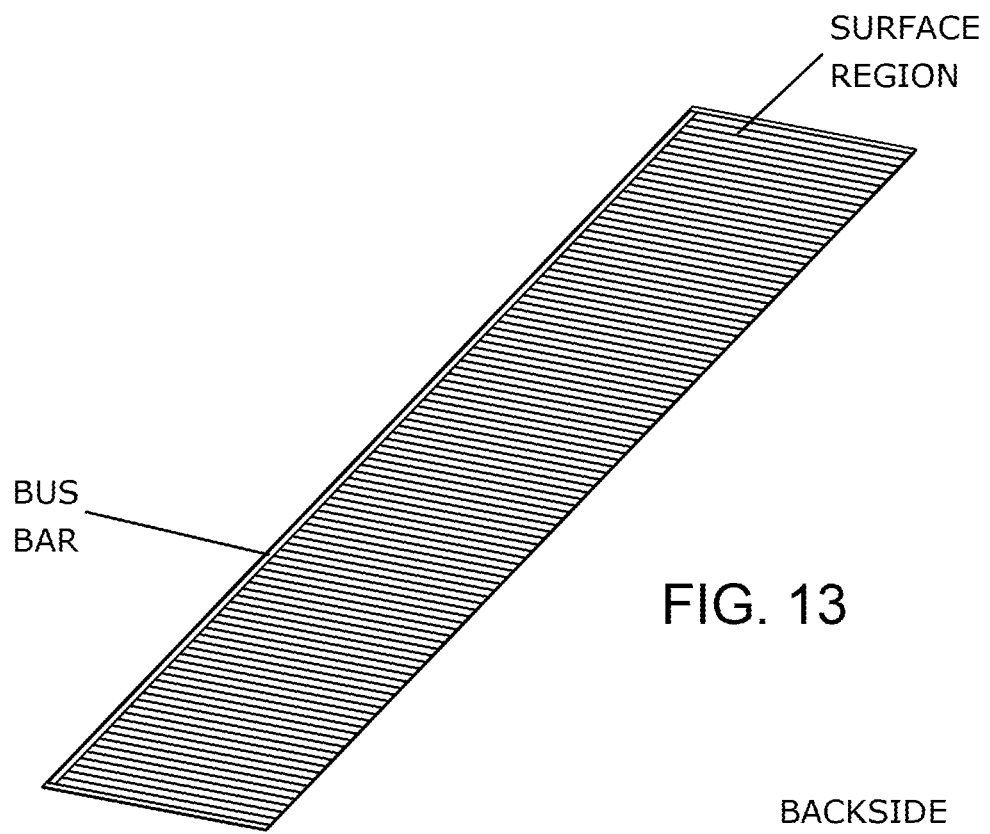
Figure 14:
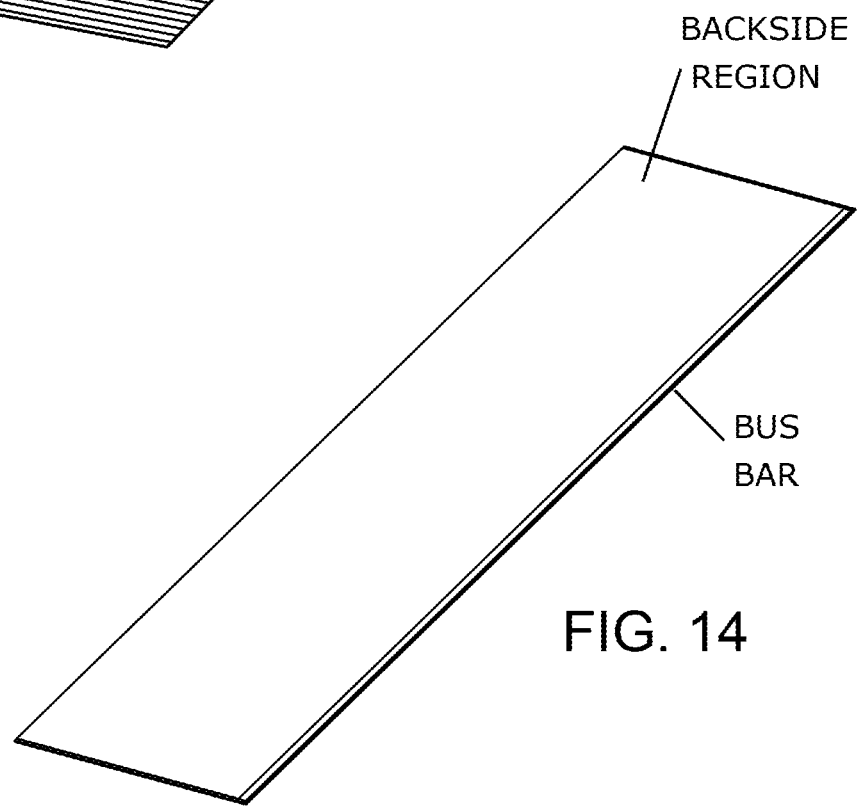

FIGS. 8-12 are illustrations of an edge photovoltaic strip according to an example of the present invention. As shown, a first end strip comprising a first edge region and a first interior region as provided on the spatial region. In an example, the first interior region comprises a first bus bar, while the first edge region on the spatial region has no bus bar. In an example, the first end strip comprises the first interior region and the first bus bar on the spatial region. The first end strip further comprises a first scribe region provided in parallel to the first bus bar. In an example, the first end strip can be similar to the last or second end strip. Referring to FIG. 9, the first end strip has a backside region, including bus bar. FIG. 10 illustrates a front view, while FIG. 11 illustrates a side view, and FIG. 12 illustrates a back view of the first end strip. In an example, each bus bar has a length (L) no greater than edge region, excluding the 45 Degree corners. Of course, there can be other variations, modifications, and alternatives.

FIGS. 13-17 are illustrations of a center photovoltaic strip according to an example of the present invention. In an example, the strip numbered 2 (e.g., FIGS. 13-17) comprises a second backside bus bar on the backside region of the strip numbered 2. In an example, the second backside bus bar in parallel to the first bus bar, and having the first scribe region defined between the first bus bar and the second backside bus bar. Referring back to FIGS. 8-12, the first end strip comprises the first edge region on the backside region. In an example, the first edge region on the backside region comprises a first backside bus bar. In an example, the strip numbered 2 can be any interior strip such as those numbered 3 and 4. In an example, each of the interior strips is rectangular in shape illustrating surface region and backside region. In an example, each of the bus bars extends from a first end to a second end of the surface region. Of course, there can be other variations, modifications, and alternatives.

Figures 19, 20:
Figure 24:
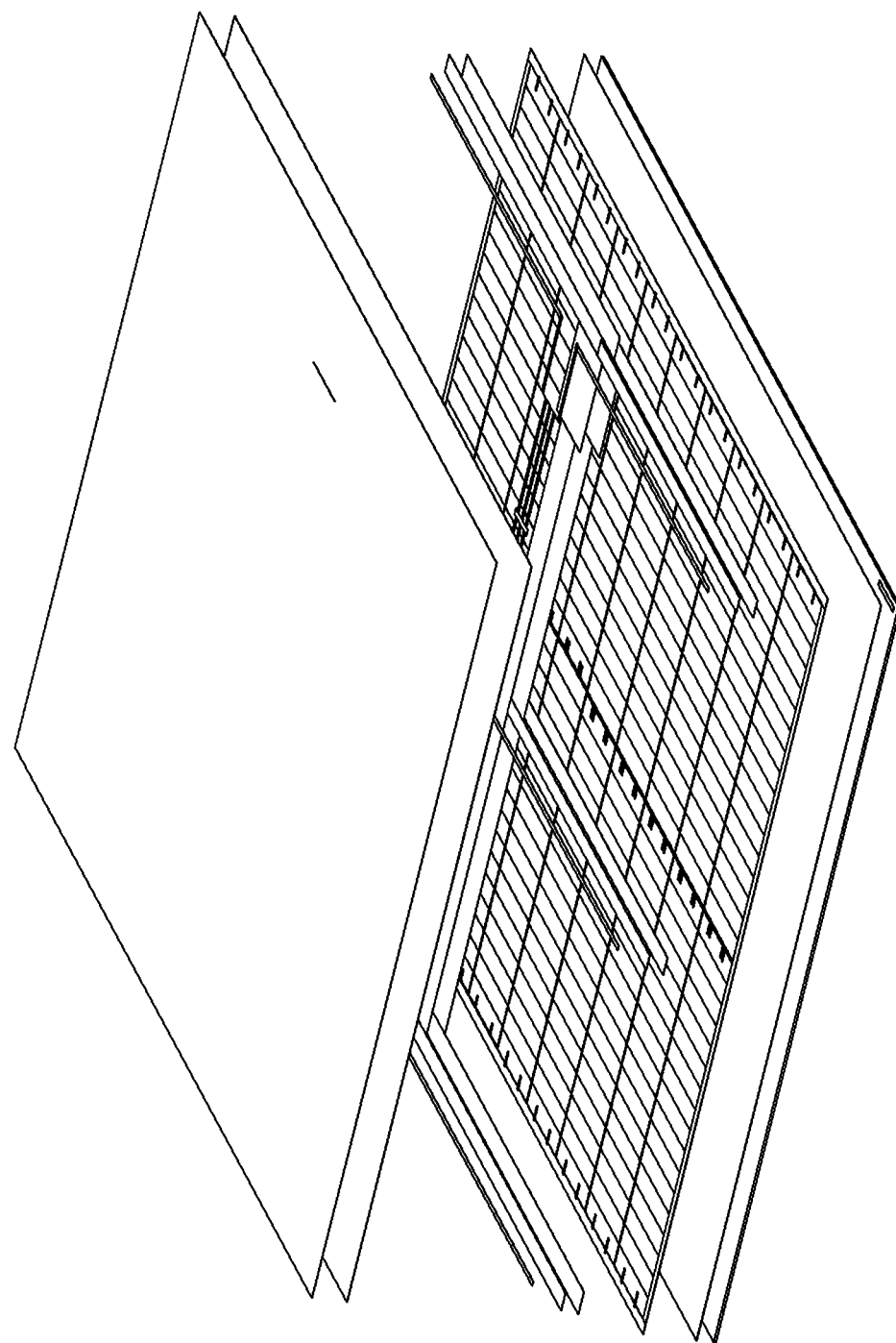
Figure 25:
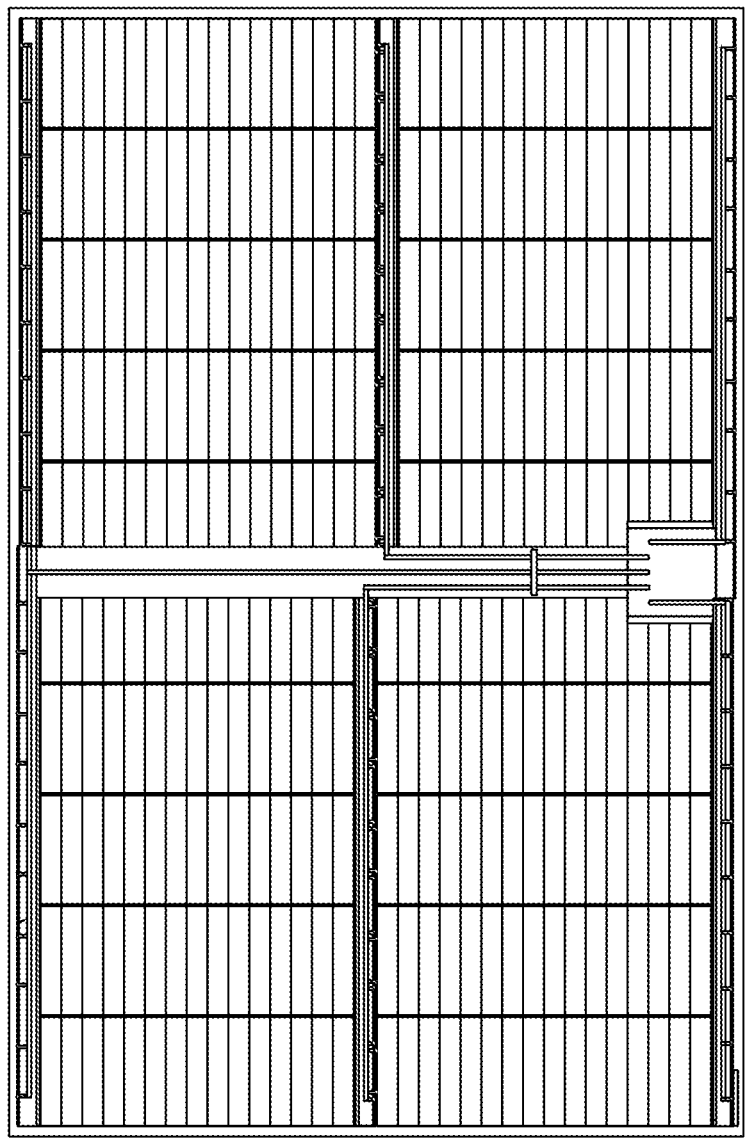

FIGS. 18A and B-20 illustrate a photovoltaic string according to an example of the present invention. In an example, each of the rectangular strips is overlaid to form the string, as shown. The string comprises seventeen strips arranged to form the string, although there can be other variations, modifications, and alternatives. FIG. 19 illustrates a back view of the string, and FIG. 20 illustrates a side view of the string of FIGS. 18A and B.

FIGS. 21-25 illustrate a solar module according to an example of the present invention. As shown, FIG. 21 illustrates a front side of a solar module, and a side view is illustrated in FIG. 22. A backside including junction box is shown in FIG. 23.

Figure 26:
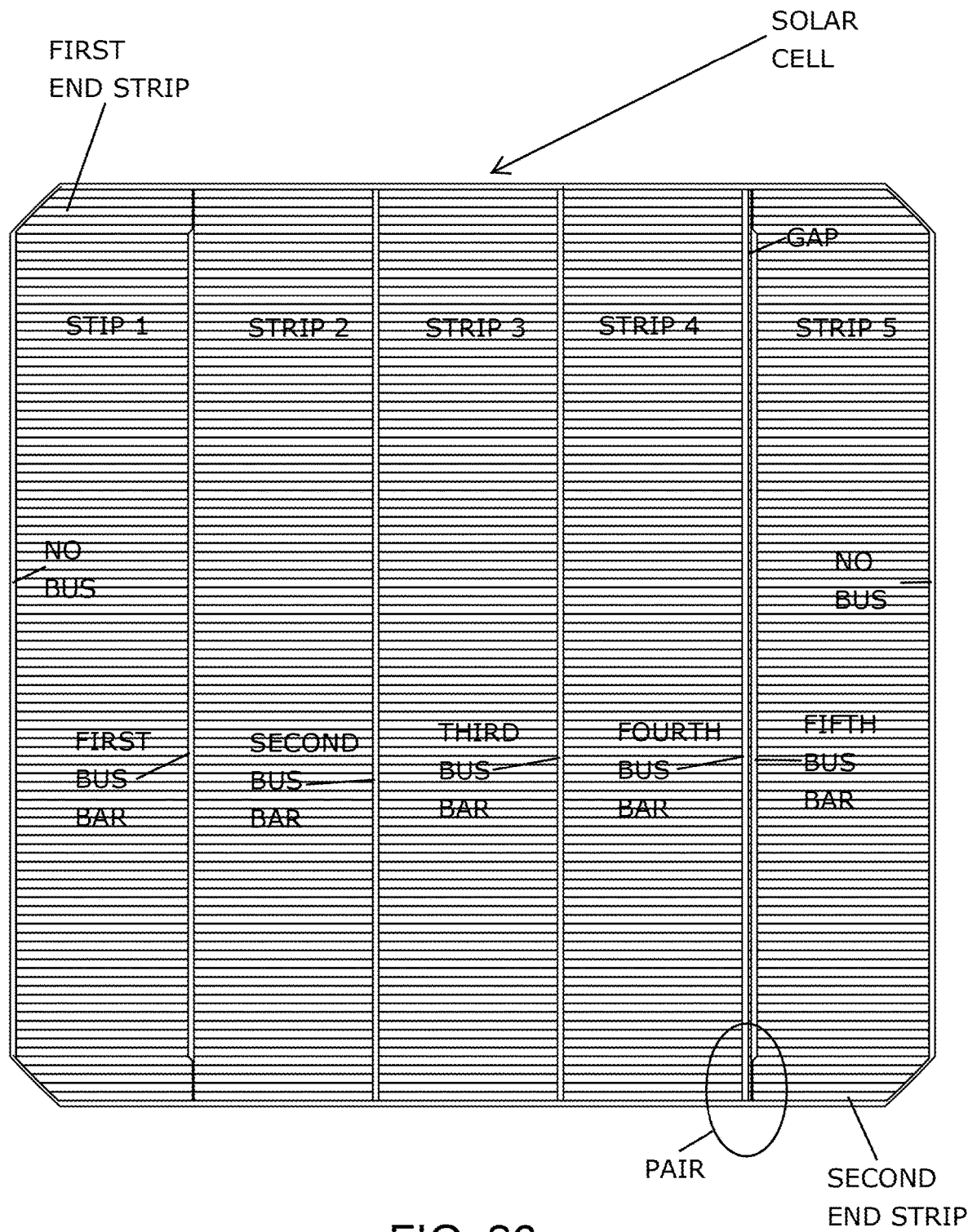
FIG. 26 is a front view of a solar cell in an example of the present invention.

FIG. 26 is a front view of a solar cell in an example of the present invention. In FIG. 26, a solar feedstock device for a solar cell device is illustrated. In an example, the device has a silicon bearing substrate member having a surface region. The surface region comprises a spatial region, as shown in FIG. 26. Now referring to FIG. 32, the device has a backside region. The silicon bearing substrate member comprises a thickness of photovoltaic material.

In an example, the feedstock device has a first end strip comprising a first edge region and a first interior region as provided on the spatial region. The first interior region comprises a first bus bar, while the first edge region on the spatial region has no bus bar. In an example, a plurality of strips as provided on the spatial region, each of the strips having a bus bar along an edge furthest away from the first bus bar, the plurality of strips being numbered from 2 to 4 from the first end strip.

In an example, a second end strip comprising a second edge region and a fifth interior region, the fifth interior region comprising a fifth bus bar such that the fifth bus bar and a bus bar from one of the plurality of strips numbered 4 forms a gap defining a scribe region. In an example, the second edge region on the spatial region comprising no bus bar.

In an example, the first end strip, the plurality of strips, and the second end strip are arranged in parallel to each other and occupying the spatial region such that the first end strip, the second end strip, and the plurality of strips consists of a total number of five (5) strips. In an example, the backside region comprises the second end strip. In an example, the second end strip comprising the second edge region. The second edge region has a fifth backside bus bar provided on the backside region.

In an example, a sixth bus formed on second edge region on the backside region of the second end strip. In an example, the first end strip, the plurality of strips, and the second end strip are arranged in parallel to each other and occupying the spatial region such that the first end strip, the second end strip, and the plurality of strips consists of a total number of five (5) strips. In an example, the backside region comprises the second end strip, the second end strip comprising the second edge region, the second edge region having the sixth backside bus bar provided on the backside region. In an example, the backside region comprises the second end strip and the strip numbered 4 such that a portion of the backside region has no busbar structure as viewed from the backside region between the six bus bar and the fifth bus bar.

In an example, the first end strip comprises a bus bar on the backside region of the first edge region. In an example, the fifth bus bar and the sixth bus bar have an equal length, such equal length is shorter than any one of the bus bars among the plurality of strips.

In an example, the first end strip comprises the first interior region and the first bus bar on the spatial region; and further comprising a first scribe region is provided in parallel to the first bus bar; and wherein the strip numbered 2 comprises a second backside bus bar on the backside region of the strip numbered 2, the second backside bus bar in parallel to the first bus bar, and having the first scribe region defined between the first bus bar and the second backside bus bar, the first end strip comprising the first edge region on the backside region, the first edge region on the backside region comprising a first backside bus bar.

In an example, the strip numbered 2 comprises a second interior region and a second bus bar on the spatial region; and further comprising a second scribe region is provided in parallel to the second bus bar; and wherein the strip numbered 3 comprises a third backside bus bar on the backside region of the strip numbered 3, the third backside bus bar in parallel to the second bus bar, and having the second scribe region defined between the second bus bar and the third backside bus bar.

In an example, the strip numbered 3 comprises a third interior region and a third bus bar on the spatial region; and further comprising a third scribe region is provided in parallel to the second bus bar; and wherein the strip numbered 3 comprises a fourth backside bus bar on the backside region of the strip numbered 3, the fourth backside bus bar in parallel to the third bus bar, and having the third scribe region defined between the third bus bar and the fourth backside bus bar.

In an example, the strip numbered 4 comprises a fourth interior region and a fourth bus bar on the spatial region; and further comprising a fourth scribe region is provided in parallel to the third bus bar; and wherein the strip numbered 4 comprises the fifth backside bus bar on the backside region of the strip numbered 4, the fifth backside bus bar in parallel to the fourth bus bar, and having the fourth scribe region defined between the fourth bus bar and the fifth backside bus bar.

In an example, a backside spacing between the fourth backside bus bar and the fifth backside bus bar is about two times a spacing between the first backside bus bar and the second backside bus bar.

Figure 27:
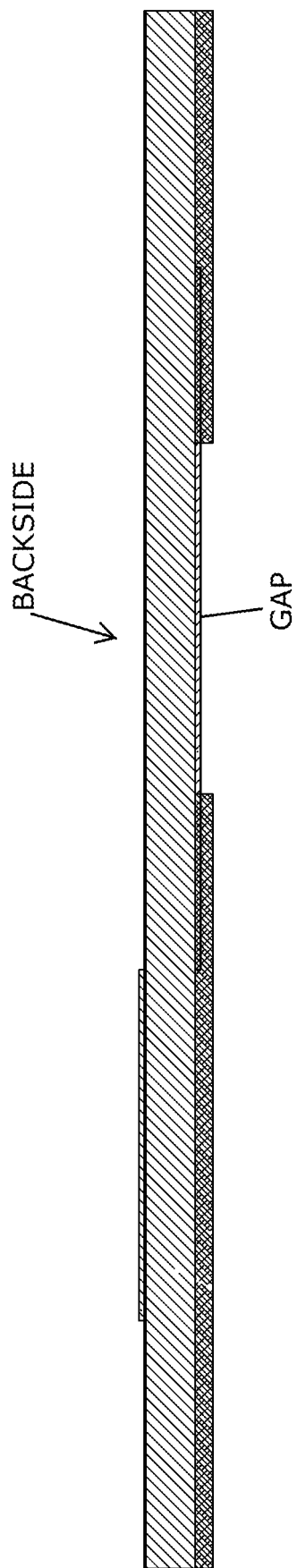
FIG. 27 is a side view of the solar cell, including bus bars, in an example of the present invention.
Figure 28:
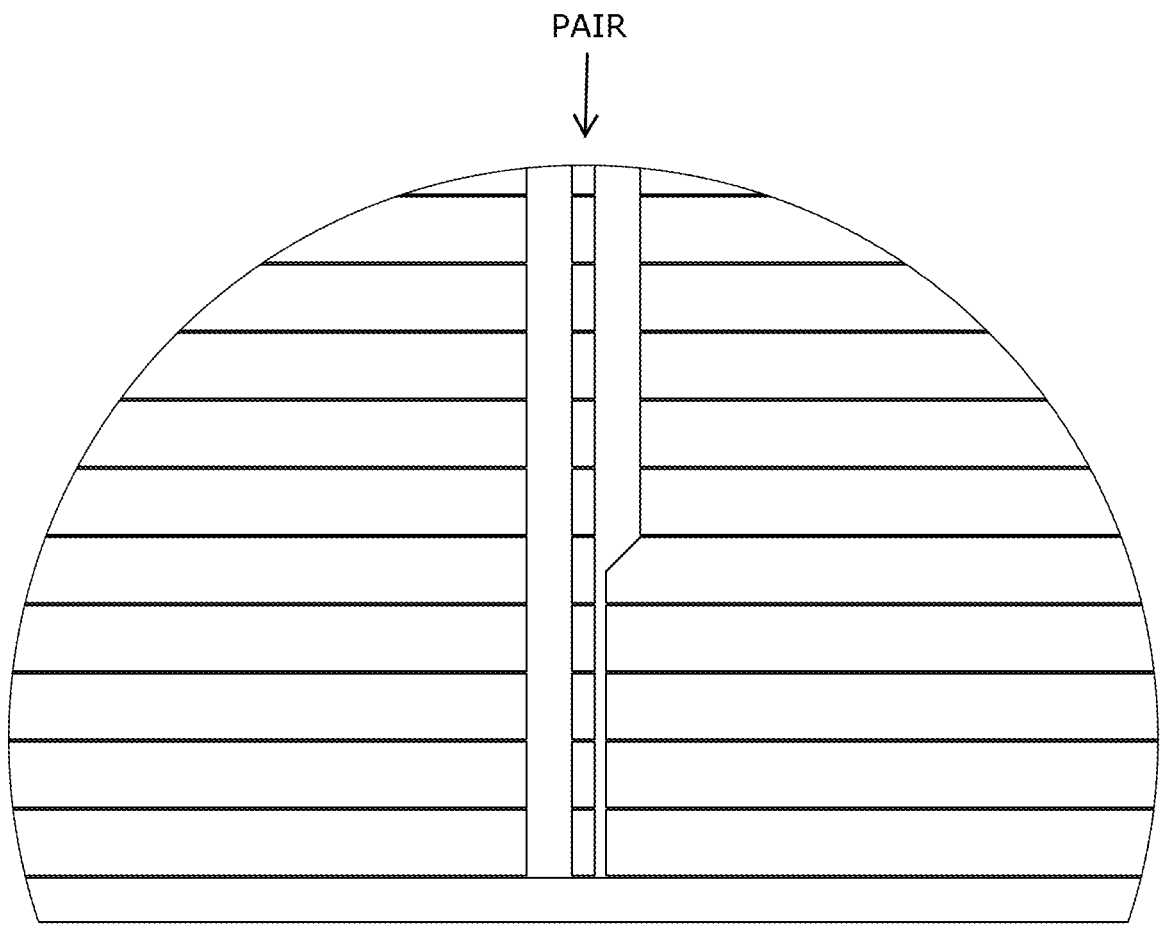
FIG. 28 is an expanded view of a bus bar in an example of the present invention.

In an example, the substrate member has a dimension of 156 mm and within about two mm. In an example, each of the strips has a desired width to be assembled in the string configuration. In an example, the plurality of strips are monolithically connected with each other. In an example, each of the plurality of strips has an aperture region. In an example, each of the plurality of strips has a width of 31.2 mm. FIG. 27 is a side view of the solar cell, including bus bars, in an example of the present invention. The side view has a thickness of material including a backside and a spatial region. A bus bar is also shown. FIG. 28 is an expanded view of a bus bar in an example of the present invention. As shown, FIG. 26 shows "PAIR" which is shown in an exploded view in FIG. 28.

In an example, the present invention provides a method of manufacturing a solar module. The method includes providing a substrate member having a surface region. In an example, the substrate is a solar cell as described in the present specification. The solar cell is made of photovoltaic material, which has various features.

In an example, the surface region comprises a spatial region and a backside region, a first end strip comprising a first edge region and a first interior region as provided on the spatial region. In an example, the first interior region comprises a first bus bar, while the first edge region on the spatial region has no bus bar, and a plurality of strips as provided on the spatial region. In an example, each of the strips has a bus bar along an edge furthest away from the first bus bar, a second end strip comprising a second edge region and a second interior region, the second interior region comprising a second bus bar such that the second bus bar and the bus bar from one of the plurality of strips forms a gap defining a scribe region, the second edge region comprising no bus bar, the first end strip, the plurality of strips, and the second end strip arranged in parallel to each other and occupying the spatial region such that the first end strip, the second end strip, and the plurality of strips consists of a total number of five (5) strips, the backside region comprising the second end strip comprising the second edge region, the second edge region having a second backside bus bar such that the second backside bus bar and the second bus bar are provided between photovoltaic material of the second end strip.

In an example, the method includes separating each of the plurality of strips. The method includes separating the first end strip, and separating the second end strip by scribing via the scribe region and removing the second end strip. Each of the separation processes can occur along a spatial direction of the substrate.

In an example, the method includes transferring the first end strip in a first magazine, transferring each of the plurality of strips into a second magazine or a plurality of magazines, and transferring the second end strip into a second magazine. In an example, the method includes selecting each of the plurality of strips, and arranging the plurality of strips in a string configuration. The method then includes using the string in the solar module.

In an example, the substrate member comprises a silicon material, the backside region further comprising a first backside bus bar on the first end strip, and a plurality of bus bars respectively formed on the plurality of strips.

In an example, the substrate member has a dimension of 156 mm and within about two mm, but can be others.

In an example, each of the strips has a desired width to be assembled in the string configuration.

In an example, the plurality of strips are monolithically connected with each other. In an example, each of the plurality of strips has an aperture region. Further details of the present invention can be found throughout the present specification and more particularly below.

Figure 29:
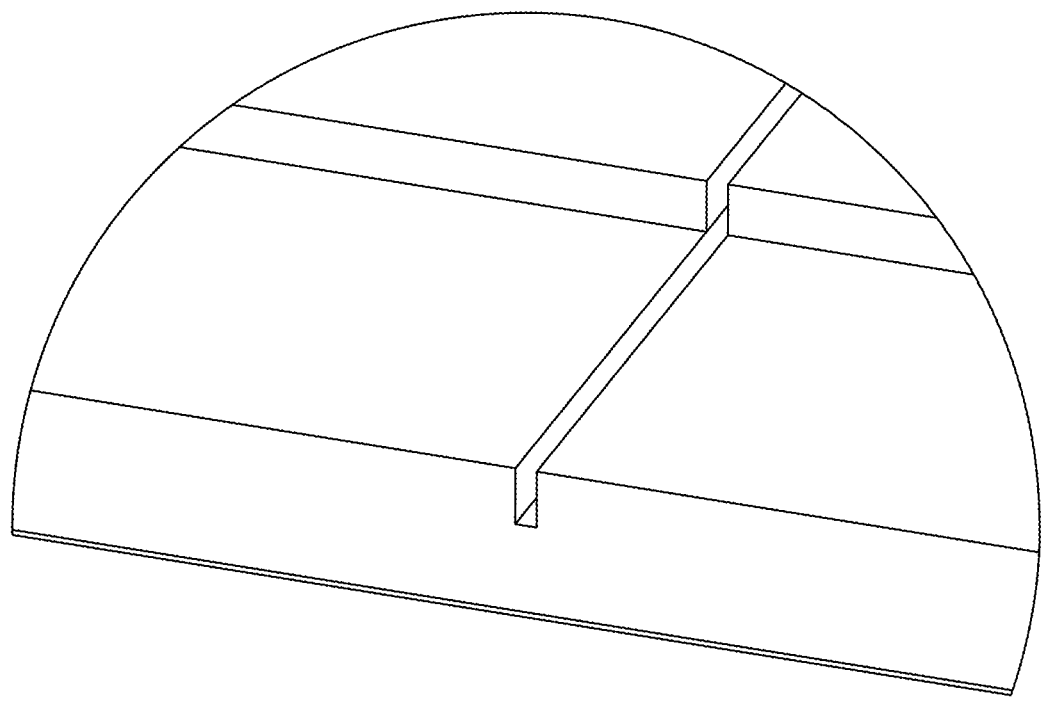
FIGS. 29-33 illustrate a solar cell under a cut and separation process according to an example of the present invention.
Figure 30:
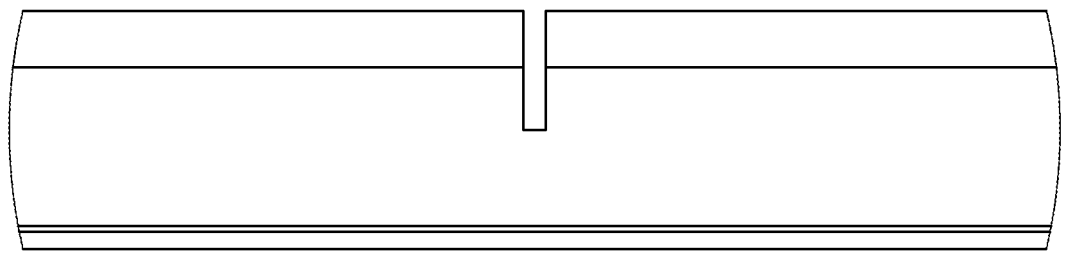
Figure 31:
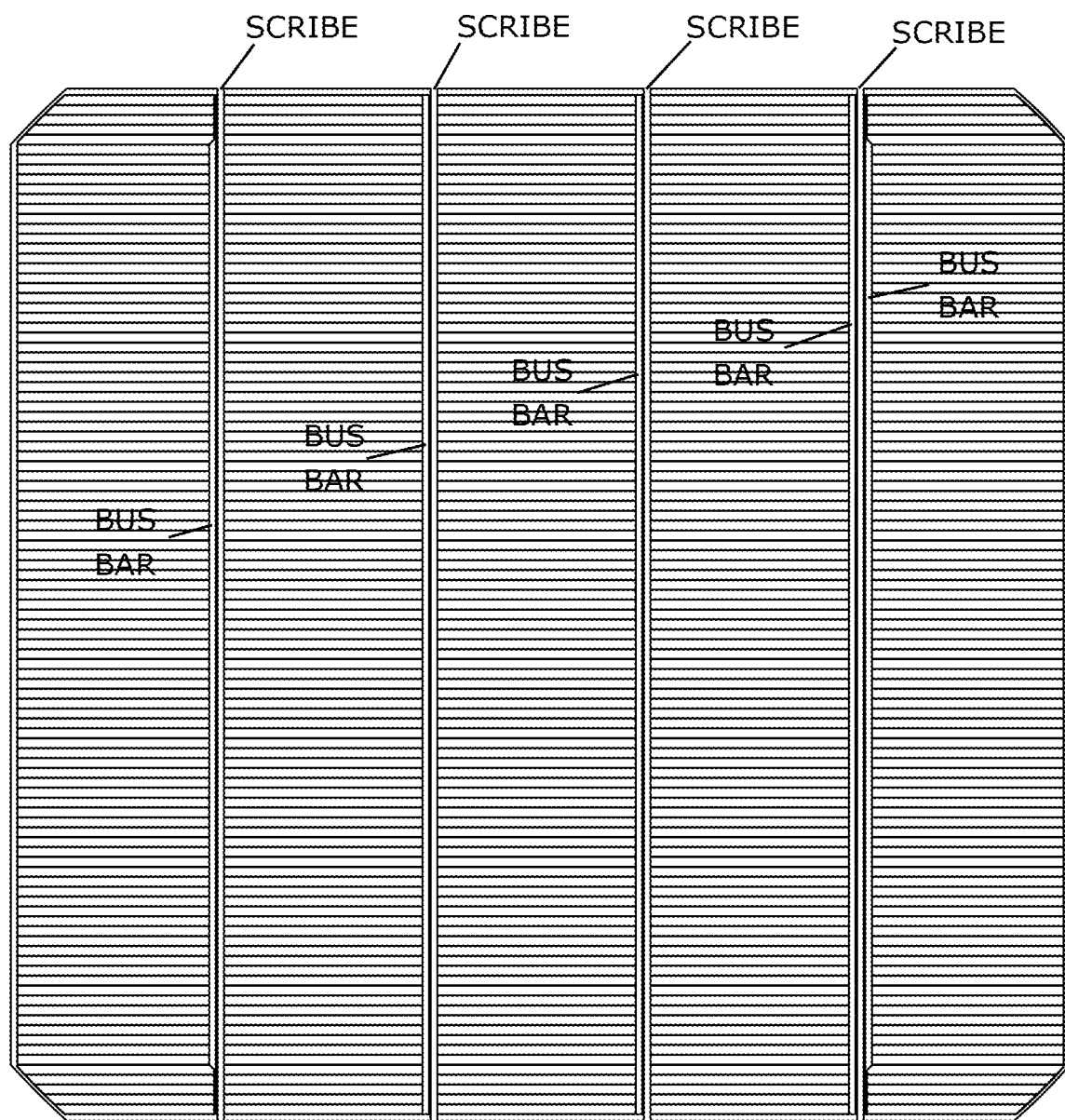
Figure 32:
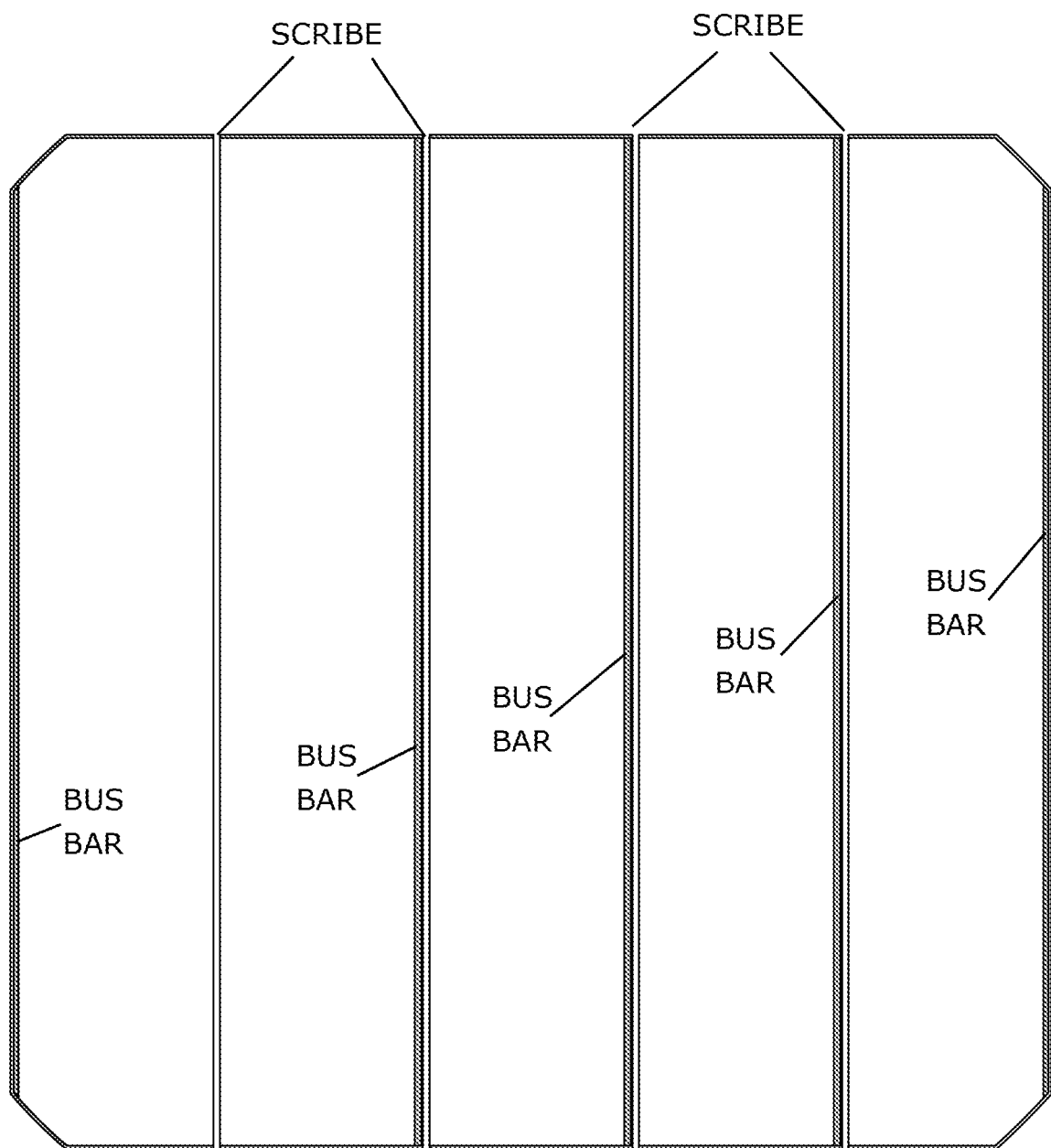
Figure 33:
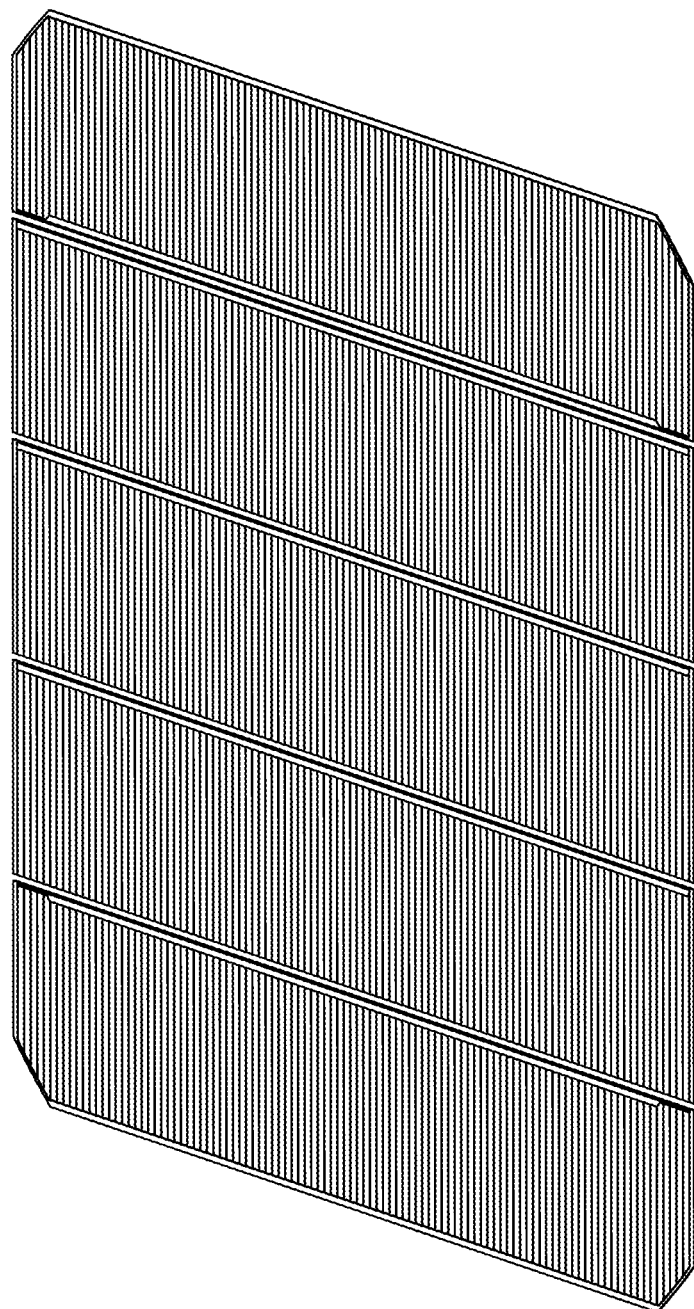

FIGS. 29-33 illustrate a solar cell under a cut and separation process according to an example of the present invention. As shown, FIGS. 29 and 30 show one of a plurality of scribe lines between each pair of strips. The scribe lines have been provided by a saw, laser cut, or other separation process. A backside and perspective view of the solar cell are shown in FIGS. 32 and 33.

Figure 34:
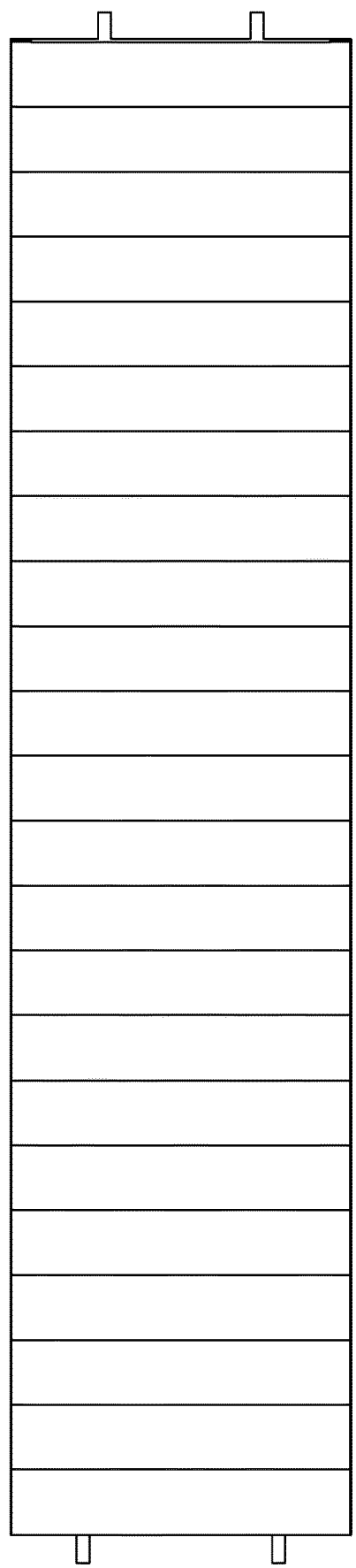
FIG. 34 is a top view of a photovoltaic string according to an example of the present invention.

FIG. 34 is a top view of a photovoltaic string according to an example of the present invention. Each string has a plurality of strips arranged in overlapping manner, as further illustrated below.

Figure 35:
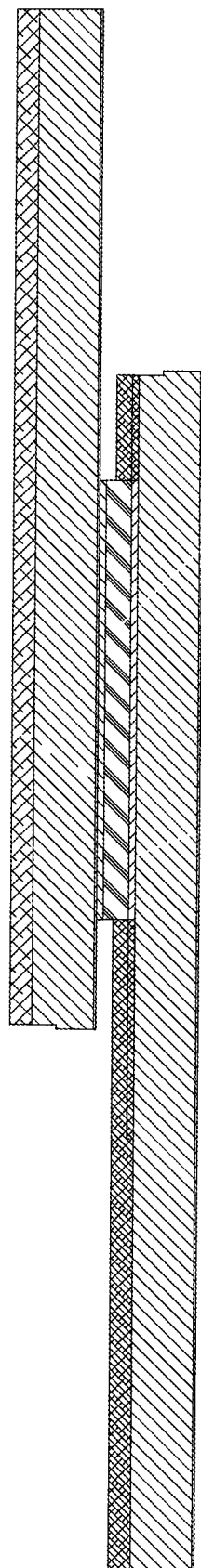
FIG. 35 is a side view of the photovoltaic string according to an example of the present invention.

FIG. 35 is a side view of the photovoltaic string according to an example of the present invention focused on a cell to cell overlap in the string. As shown, a strip having a backside is overlapped with an edge of a surface of a strip, each of which is coupled using a bus bar, as shown.

Figure 36:
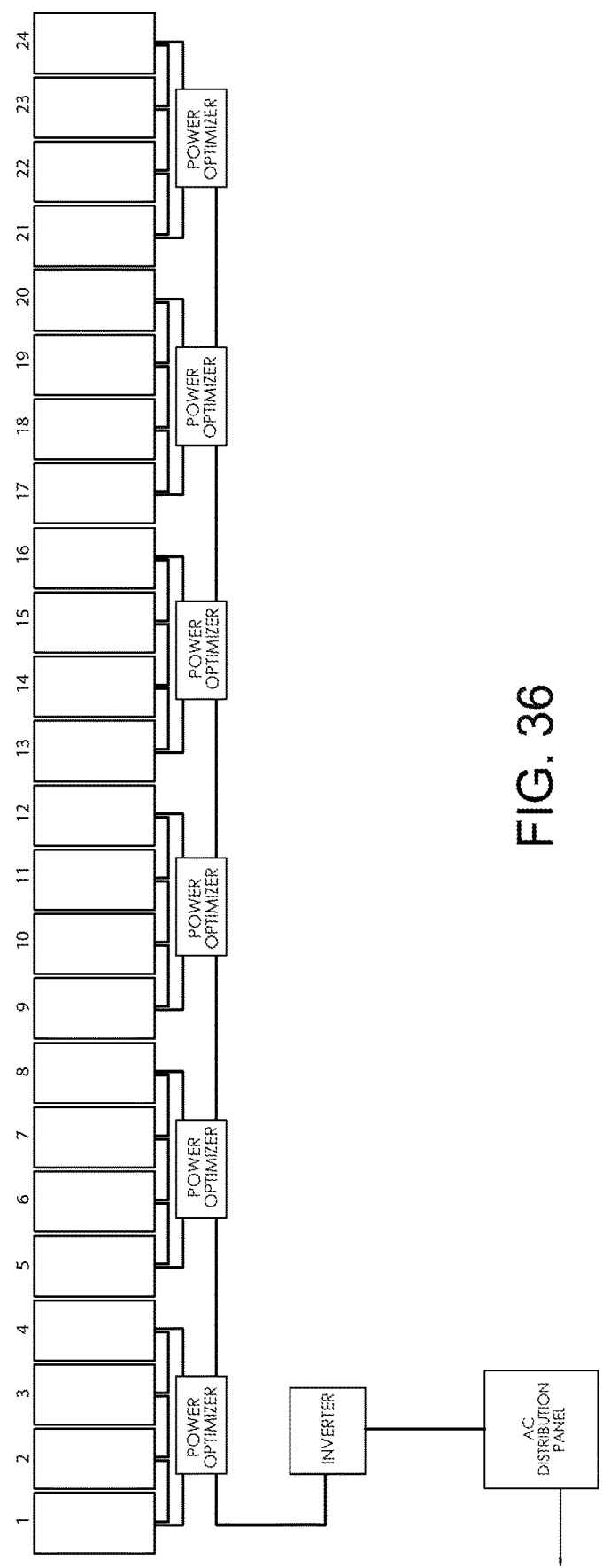
FIG. 36 is a simplified diagram of a simplified system diagram according to an example of the present invention.

FIG. 36 is a simplified diagram of a simplified system diagram according to an example of the present invention. Further details of the present invention can be found throughout the present specification and more particularly below.

In an example, the present method and system utilized a $1/5^{th}$ strip width versus $1/3^{rd}$, $1/4^{th}$ or $1/6^{th}$ of a cell strip width based upon some unexpected benefits and/or results, as shown in the table below.

|  | PV Width | | | | | Comment |
|---|---|---|---|---|---|---|
| Width | 78 | 52 | 39 | 31.2 | 26 | mm |
| Cell Current | 4.5 | 3 | 2.25 | 1.8 | 1.5 | Isc = 9A standard cell |
| Fingers | 80-200 | 80-150 | 80-120 | 80-100 | 80 | (Microns) Based on standard cell finger |
| Shading | 7.0% | 5.8% | 5.0% | 4.5% | 4% | Finger shading |
| Cell Utilization | 98.7% | 97.4% | 96.2% | 94.9% | 93.6% | 2 mm overlap |
| Placements | 2X | 3X | 4X | 5X | 6X | Over standard module |
| Fill Factor | 76% | 77% | 78% | 79% | 79% | |

In an example, the present strip has a width that is the size of the cut cell. In an example, current is directly proportional to the size of the strip. Fingers have to carry current across the whole length of the strip, while shading is the area of the strip shadowed by the fingers. In an example, cell utilization is the amount of cell area used for overlapping versus active area. In an example, number of placements is how many time as strip must be placed compared to a cell. In an example, fill factor is the efficiency of the cell versus is maximum power producing potential.

In an example, the purpose of designing a module to get the IV specifications, as similar as a conventional module (Voc, Vmp, Isc, Imp, Power). In an example, the present method and designs (lower voltage, and higher current for the tracker application, higher voltage and lower current for the residential module with module power electronics.

In an example, the present method and design uses a 31.2 mm strip width, which optimized the size as standard and module, as well as a current and voltage similar to standard modules. This allowed the present invention to take advantage of standard inverters, electronics, and mechanical features.

The claims and drawings are focused on the interior strips. In an example, each of the strings of strips can be made with the pseudo square (exterior) strips as well.

In an example, in the table, it is demonstrated that going to smaller strips provides higher efficiency. The marginal efficiency gains, however, decline as the strip width gets smaller. The difference between a $1/5^{th}$ strip from a cell and $1/6^{th}$ strip from a cell in efficiency is very small. Smaller strips do come with other issues that make smaller strips less attractive. In an example, smaller strips require more since there are more of them. In particular, more strips are handled, and assembled. The manufacturing costs and equipment capex increase more than the efficiency gain is worth. In addition, smaller strips lead to more cell to cell overlap that uses up silicon. Having more cell to cell overlaps increases the silicon cell usage and increased costs.

Most importantly, there are standard module sizes in solar industry that are primarily dictated by the size of the photovoltaic cell. In an example, sixty (60) cell modules are primarily used on roof-top applications. Such sixty cell modules are typically about 1.6 m long by 1 m wide in dimensions. Ground mount utility modules are typically 72 cells and are almost 2 m long by 1 m wide in dimensions. For the present module, it is desirable to maintain them within one of these form factors. Almost every installer in the world has racking and mounting hardware designed around this basic size. Many have automated engineering software for system design that also has these sizes embedded in them. Of course, there can be slight variations, although making the present module in the standard cell format is highly desired.

Still another feature relates to a open circuit voltage on a cold clear sunny day. Typically, solar module systems are rated for 600 VDC or 1000 VDC. The system engineering, inverter designs, national electric code are all standardized not to exceed one of these voltages. The installation cost is highly influenced by the number of modules that can be hooked up in series without exceeding the maximum voltage. As such, the present module electrical specification needs to be as similar as possible to the industry standard modules (60 or 72) cell.

It has been discovered that $1/5^{th}$ strip width is the best strip width to simultaneously allow for the maximized performance, lowest manufacturing costs, industry standard size, and industry standard electrical characteristics, each of which has been unexpected. The present $1/5$ strip width is slightly larger in width than the conventional $1/6^{th}$ strip widths. The $1/5$ strip width has higher assembly costs than the $1/6$ strip width. Cell utilization will be less, however, the $1/5$ strip width performance will be about the same. The $1/6$ strip width module has a module voltage that is about 20% higher causing higher installation costs. In other examples, the $1/4$ cut strips will lose much of the efficiency gain associated with the $1/5^{th}$ strip width and will be a much higher current and lower voltage module than is normal in the industry. There will be increased costs for handling the higher current including thicker conductors, larger bypass diodes, and maybe a special junction box. The $1/5^{th}$ strip width is novel and benefits unexpected. Generally all conventional modules use $1/6^{th}$ strip width. It would be great if we could lock up $1/5^{th}$ strip width. Of course, there can be other variations, modifications, and alternatives.

This application is also related to U.S. Ser. No. 14/869,130 filed Sep. 29, 2015 (under Attorney Docket No. A906RO-018110US), titled SOLAR MODULE WITH DIODE DEVICE FOR SHADING, in the name of Kevin R. Gibson, which is hereby incorporated by reference in its entirety for all purposes.

While the above is a complete description of specific embodiments of the invention, the above description should not be taken as limiting the scope of the invention as defined by the claims.

The invention claimed is:

1. A solar feedstock device for a solar cell device comprising:
   a substrate member having a surface region, the surface region comprising a spatial region and a backside region, the substrate member comprising a thickness of photovoltaic material;
   a first end strip comprising a first edge region and a first interior region as provided on the spatial region, the first interior region comprising a first bus bar, while the first edge region on the spatial region has no bus bar;
   a plurality of strips as provided on the spatial region, each of the strips having a bus bar along an edge furthest away from the first bus bar, the plurality of strips being numbered from 2 to 4 from the first end strip;
   a second end strip comprising a second edge region and a fifth interior region, the fifth interior region comprising a fifth bus bar such that the fifth bus bar and a bus bar from one of the plurality of strips numbered 4 forms a gap defining a scribe region including a scribe line, the second edge region on the spatial region comprising no bus bar;
   wherein the first end strip, the plurality of strips, and the second end strip are arranged in parallel to each other and occupying the spatial region such that the first end strip, the second end strip, and the plurality of strips consists of a total number of five (5) strips;
   wherein the backside region comprises the second end strip, the second end strip comprising the second edge region, the second edge region having a sixth backside bus bar provided on the backside region, wherein the first end strip, the second end strip, and the plurality of strips are of a same width.

2. The device of claim 1 wherein the first end strip comprises the first interior region and the first bus bar on the spatial region; and further comprising a first scribe region is provided in parallel to the first bus bar; and wherein the strip numbered 2 comprises a second backside bus bar on the backside region of the strip numbered 2, the second backside bus bar in parallel to the first bus bar, and having the first scribe region defined between the first bus bar and the second backside bus bar, the first end strip comprising the first edge region on the backside region, the first edge region on the backside region comprising a first backside bus bar.

3. The device of claim 2 wherein the strip numbered 2 comprises a second interior region and a second bus bar on the spatial region; and further comprising a second scribe region is provided in parallel to the second bus bar; and wherein the strip numbered 3 comprises a third backside bus bar on the backside region of the strip numbered 3, the third backside bus bar in parallel to the second bus bar, and having the second scribe region defined between the second bus bar and the third backside bus bar.

4. The device of claim 3 wherein the strip numbered 3 comprises a third interior region and a third bus bar on the spatial region; and further comprising a third scribe region is provided in parallel to the second bus bar; and wherein the strip numbered 3 comprises a fourth backside bus bar on the backside region of the strip numbered 3, the fourth backside bus bar in parallel to the third bus bar, and having the third scribe region defined between the third bus bar and the fourth backside bus bar.

5. The device of claim 4 wherein the strip numbered 4 comprises a fourth interior region and a fourth bus bar on the spatial region; and further comprising a fourth scribe region is provided in parallel to the third bus bar; and wherein the strip numbered 4 comprises the fifth backside bus bar on the backside region of the strip numbered 4, the fifth backside bus bar in parallel to the fourth bus bar, and having the fourth scribe region defined between the fourth bus bar and the fifth backside bus bar.

6. The device of claim 1 wherein the substrate member has a dimension of 156 mm and within about two mm.

7. The device of claim 1 wherein each of the strips has the same width to be assembled in the string configuration.

8. The device of claim 1 wherein the plurality of strips are monolithically connected with each other.

9. The device of claim 1 wherein each of the plurality of strips has an aperture region.

10. The device of claim 1 wherein each of the plurality of strips has a width of 31.2 mm.

11. A solar feedstock device for a solar cell device comprising:
   a substrate member having a surface region, the surface region comprising a spatial region and a backside region, the substrate member comprising a thickness of photovoltaic material;
   a first end strip comprising a first edge region and a first interior region as provided on the spatial region, the first interior region comprising a first bus bar, while the first edge region on the spatial region has no bus bar;
   a plurality of strips as provided on the spatial region, each of the strips having a bus bar along an edge furthest away from the first bus bar, the plurality of strips being numbered from 2 to 4 from the first end strip;
   a second end strip comprising a second edge region and a fifth interior region, the fifth interior region comprising a fifth bus bar such that the fifth bus bar and a bus bar from one of the plurality of strips numbered 4 forms a gap defining a scribe region including a scribe line, the second edge region on the spatial region comprising no bus bar;
   a sixth bus bar formed on second edge region on the backside region of the second end strip;
   wherein the first end strip, the plurality of strips, and the second end strip are arranged in parallel to each other and occupying the spatial region such that the first end strip, the second end strip, and the plurality of strips consists of a total number of five (5) strips;
   wherein the backside region comprises the second end strip, the second end strip comprising the second edge region, the second edge region having the sixth backside bus bar provided on the backside region;
   wherein the backside region comprises the second end strip and the strip numbered 4 such that a portion of the backside region has no busbar structure as viewed from the backside region between the sixth bus bar and the fifth bus bar, wherein the first end strip, the second end strip, and the plurality of strips are of a same width.

12. The device of claim 11 wherein the first end strip comprises a bus bar on the backside region of the first edge region.

13. The device of claim 12 wherein the fifth bus bar has a first length and the sixth bus bar has a second length, such that the first and second lengths are equal to each other, and each of the other bus bars within the plurality of bus bars in the feedstock include a length which exceeds the first length and second length.

* * * * *